United States Patent
Rennie

[11] Patent Number: 6,057,564
[45] Date of Patent: May 2, 2000

[54] SEMICONDUCTOR DEVICE HAVING A GANO REGION INTERMEDIATE A GAN-BASED CONTACT REGION AND AN ELECTRODE

[75] Inventor: John Rennie, Tokyo, Japan

[73] Assignee: Kabushiki Kaisha Toshiba, Japan

[21] Appl. No.: 09/119,961

[22] Filed: Jul. 21, 1998

[30] Foreign Application Priority Data

Jul. 30, 1997 [JP] Japan .................................. 9-204405

[51] Int. Cl.⁷ .................................................. H01L 33/00
[52] U.S. Cl. .............................. 257/99; 257/79; 257/94; 257/103; 257/9; 257/12; 257/13; 257/613; 257/615; 257/744; 257/745
[58] Field of Search .......................... 257/103, 79, 9–13, 257/76, 94, 96, 97, 99, 102, 613, 615, 744, 745, 749

[56] References Cited

U.S. PATENT DOCUMENTS

| | | | |
|---|---|---|---|
| 4,416,952 | 11/1983 | Nishizawa | 428/698 |
| 4,608,581 | 8/1986 | Bagratishvili et al. | 357/17 |
| 5,804,834 | 9/1998 | Shimoyama et al. | 257/22 |
| 5,877,558 | 3/1999 | Nakamura et al. | 257/749 |
| 5,889,295 | 3/1999 | Rennie et al. | 257/96 |
| 5,912,498 | 6/1999 | Hobson et al. | 257/410 |
| 5,932,896 | 8/1999 | Sugiura et al. | 257/94 |

FOREIGN PATENT DOCUMENTS 55-138238  10/1980  Japan .

OTHER PUBLICATIONS

H. Ishikawa et al., "Effects of Surface Treatments and Metal Work Functions on Electrical Properites at p–GaN/metal Interfaces", J. Appl. Phys., 81(3):1315–1322 (1997).

L.L. Smith et al., "Cleaning of GaN Surfaces", Journal of Electronic Materials, 25(5) :805–810 (1996).

*Primary Examiner*—Jerome Jackson, Jr.
*Assistant Examiner*—Bradley William Baumeister
*Attorney, Agent, or Firm*—Finnegan, Henderson, Farabow, Garrett & Dunner, L.L.P.

[57] ABSTRACT

A thin oxide region is introduced to a surface of a GaN layer prior to contact meal evaporation by carefully controlling the oxidation of the surface. This results in the normally present surface states to be smothered and thus a low band offset is observed in an ohmic contact comprising the contact metal and the GaN layer. The thickness of the oxide region preferably is about 8 Å to 25 Å. Other elements such as S, Se, Te, As, P and Hf can be used as an alternative to O. Devices using the thin region in the ohmic contact may include semiconductor laser devices, light emitting diodes, and III–V based transistors.

8 Claims, 13 Drawing Sheets

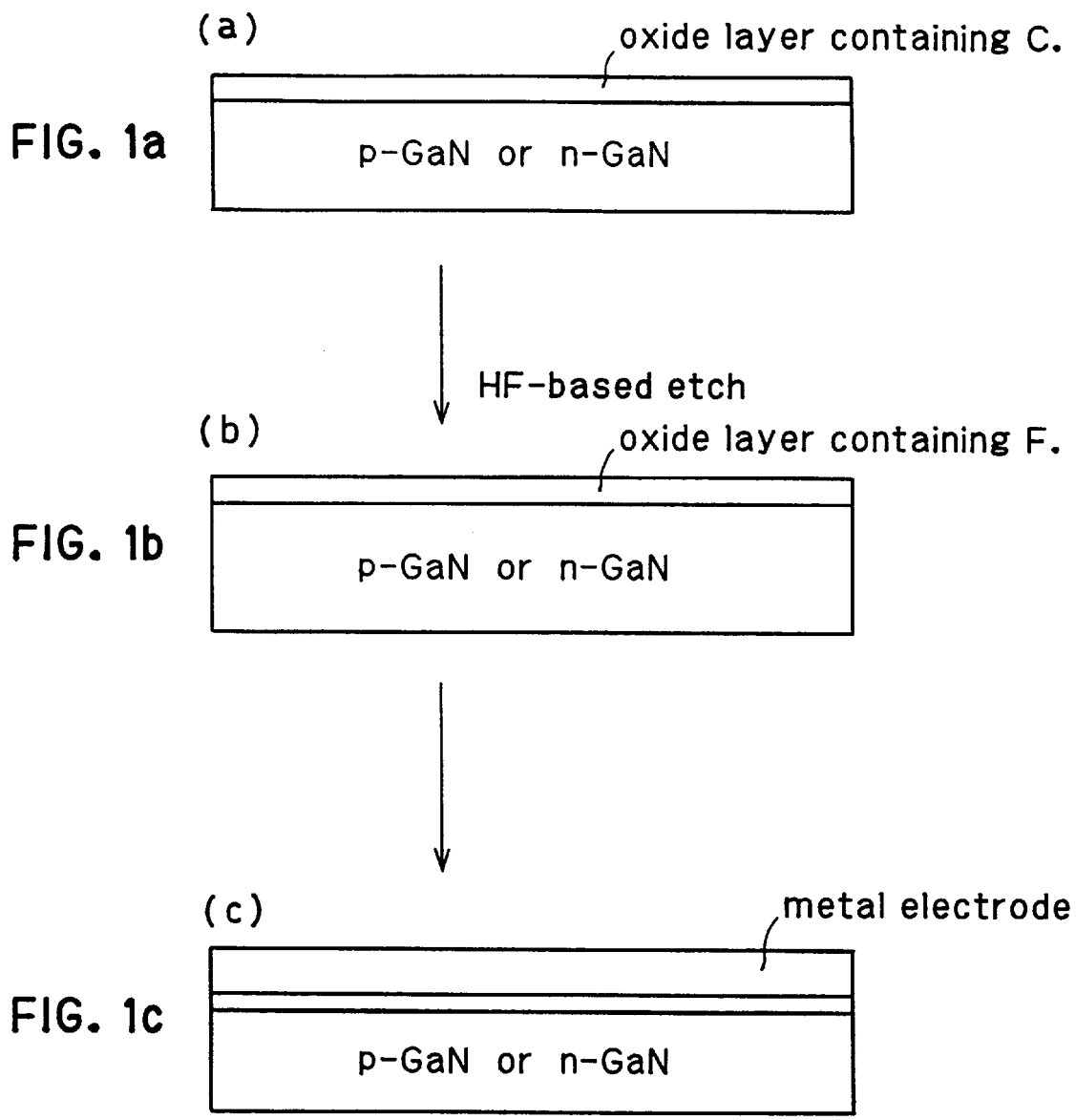

FIG. 2 p-GaN
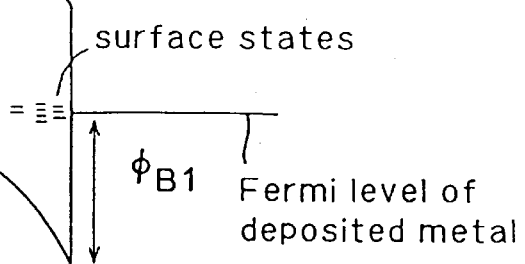
FIG. 3 p-GaN
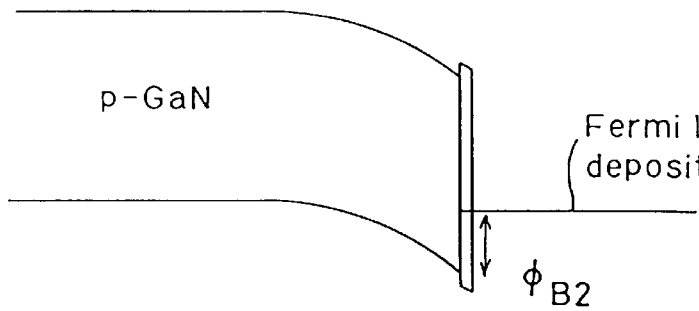

SEMICONDUCTOR DEVICE HAVING A GANO REGION INTERMEDIATE A GAN-BASED CONTACT REGION AND AN ELECTRODE

FIELD OF THE INVENTION

The present invention relates to semiconductor devices, and more particularly to metal electrode relates junctions on semiconductor devices, such as light emitting diodes.

BACKGROUND OF THE INVENTION

From the first successful p-type doping of GaN with Mg, many devices have been constructed with the objective of producing commercially viable lasers in the ultraviolet and blue range of the optical spectrum. However, although limited lasing has been achieved, there remain many problems to be overcome. One of the main problems is that the operation voltages and the threshold currents are too large. The main reason for this is that even the use of contacts consisting of metals of the highest workfunctions does not produce perfect ohmic contacts to p-type GaN. Thus, metals such as Ni, are used and the resultant non-perfect ohmic contact is accepted as an unwanted but inherent feature of the GaN based devices. Many have attempted to employ various temperature annealing methods to lower the contact resistance of the used meal contacts without any substantial success (see H. Ishikawa, S. Kobayashi Y. Koide, S. Yamasaki, S. Nagai, J. Umezali, M. Koike, and M. Murakami; "Effects of Surface Treatments and Metal Work Functions on Electrical Properties at p-GaN/Metal Interfaces," *J. Appl. Phys.*, 81 (1997) p1315), this is even the case for contacts to n-type GaN, where the problems are an order of magnitude lower than that of the subsequently grown p-type regions (see F. Ren, S. J. Pearton, S. Donovan, C. R. Abernathy and M. W. Cole; "Ohmic Contacts on Binary and Ternary Nitrides," *Electrochemical Society Proceedings*, Vol. 96-11, 1996, P122).

The chemical treatment of the GaN surfaces prior to metal evaporation has also been reported on (see for example L. L. Smith, S. W. King, R. J. Nemanichand, R. F. Davis; "Cleaning of GaN Surfaces," *J. Electronic Materials*, Vol. 25(1996) p805) and most people skilled in the art agree that the use of hydrofluoric acid (HF) based etches produces the best surface for subsequent contacts. Thus, most of the work on the production of low resistivity contacts to p-type and n-type GaN are now mainly along the lines of trying to boost the dopant densities in the GaN contact layers and/or the use of intermediate band materials, such as InGaN based materials, to reduce the effective barrier seen by the carriers trying to enter the GaN contact regions.

SUMMARY OF THE INVENTION

The problem with the present technology, that an object of the present invention is to resolve, is that workers to date have concluded that the high contact potential is a problem of the low doping efficiency of GaN. However, the present invention provides a semiconductor device structure and the method of manufacturing the same by which the surface states of GaN are controlled to such an extent that reduces the normally very high Schottky barrier contacts to almost purely ohmic contacts can be produced. Thus, the present invention resolves the hitherto unrealized problem of the strong effect of surface states in GaN on the contact resistance of metals in contact to said material. For example, by nullifying and thus obtaining a reduction in the operation voltages, GaN devices can be obtained that have longer lifetimes, lower threshold current densities, and reduced operation voltages.

The main method used to overcome the problem outlined above is to control the surface of GaN prior to metal evaporation. This is done by carefully controlling the oxidation of the surfaces prior to the metal evaporation. This results in the normally present surface states to be smothered and thus a low band offset is observed between the contact metal and GaN. Thus, these new techniques may be used to construct lasers in such a manner as to substantially improve the efficiency of these devices and to raise the maximum operation output powers of these GaN based devices.

In a first aspect, the present invention provides a semiconductor device comprising an active region disposed between a GaN based first contact region and a second contact region, a first intermediate region consisting of GaN and O and disposed between the first GaN based contact region and a first metal electrode, the first metal electrode forming ohmic contact region with the first GaN based contact region through the intermediate region, and a second metal electrode coupled to the second contact region.

In the present invention, the average thickness of the first intermediate layer consisting of GaN and O is preferred to be in the range from 8 Å to 25 Å. The average thickness maybe measured by conventional methods, using SIMS or other instruments. The electrode metal in direct contact with GaN may comprise metal selected from the group consisting of Ni, Pd, Ir, Au and Pt or an alloy based on a metal selected from the group.

The semiconductor device of the present invention may further comprise a second intermediate layer disposed between the second contact region and the second electrode, wherein the second contact region is GaN based. The semiconductor device of the present invention may further comprise a optical guide region disposed between the active region and a first clad region, a second optical guide region disposed between the active region and a second clad region, the first clad region disposed between the first optical guide region and the first GaN based contact region, and the second clad region disposed between the second optical guide region and the second contact region. The present invention may further comprise an isolated stripe region surrounded by an insulator or counter doped region. According to the present invention dangling bonds of GaN in the first contact region may be terminated with O.

The present invention may further comprise a multilayer structure and a second intermediate layer consisting of GaN and O. The multilayer structure comprises the active region, the GaN based first contact region, the second contact region, the first intermediate region, the first metal electrode, the second metal electrode, the first optical guide region, the first clad region, the second optical guide region, and the second clad region. The multilayer structure is disposed above an insulator substrate. The second contact region is GaN based. The second electrode is disposed on the second contact region through the second intermediate layer.

The present invention may further comprise a multilayer structure comprising the active region, the GaN based first contact region, the second contact region, the first intermediate region, the first metal electrode, the second metal electrode, the first optical guide region, the first clad region, the second optical guide region, and the second clad region. The multilayer structure is disposed above a first surface of a conductive substrate, and the second metal electrode is disposed on a second surface of the conductive substrate.

In a second aspect, the present invention provides a semiconductor device comprising an active region disposed between a GaN based first contact region and a second contact region, first and second electrodes, a first intermediate region disposed between the GaN based first contact region and the first metal electrode. The first intermediate region consists essentially of GaN and one selected from the group consisting of S, Se, Te, As, P, and Hf. The first metal electrode forms an ohmic contact with the first GaN based contact region through the first intermediate region. The second metal electrode is coupled to the second contact region.

In the present invention, the average thickness of the first intermediate layer is also preferred to be within the range 8 Å to 25 Å. The metal electrode may comprise at least one metal selected from the group consisting of Ni, Pd, Ir, Au and Pt or an alloy based on metals selected from the group. The semiconductor device of the present invention may further comprise a second intermediate layer disposed between the second contact region and the second electrode, wherein the second contact region is GaN based. The semiconductor device of the present invention may further comprise a first optical guide region disposed between the active region and a first clad region, and a second optical guide region disposed between the active region and a second clad region. The first clad region is disposed between the first optical guide region and the first GaN based contact region, and the second clad region is disposed between the second optical guide region and the second contact region. The present invention may further comprise an isolated stripe region surrounded by an insulator or counter doped region. According to the present invention, dangling bonds of GaN in the first contact region may be terminated with O.

The present invention may further comprise a second intermediate layer consisting of GaN and O, and a multilayer comprising the active region, the GaN based first contact region, the second contact region, the first intermediate region, the first metal electrode, the second metal electrode, the first optical guide region, the first clad region, the second optical guide region, and the second clad region. The multilayer is disposed above an insulator substrate. The second contact region is GaN based. The second electrode is disposed on the second contact region through the second intermediate layer.

The present invention may further comprise a multilayer comprising the active region, the GaN based first contact region, the second contact region, the first intermediate region, the first metal electrode, the second metal electrode, the first optical guide region, the first clad region, the second optical guide region, and the second clad region which is disposed above a first surface of a conductive substrate. The second metal electrode is disposed on a second surface of the conductive substrate.

In a third aspect, the present invention provides a method of manufacturing the semiconductor device including forming a GaN based contact region above an active region, etching the initially formed natural or otherwise oxide layer on a surface of the GaN based contact region, forming an intermediate region consisting of GaN and O, and forming a metal electrode on the intermediate region consisting of GaN and O.

In a fourth aspect, the present invention provides a method of manufacturing the semiconductor device comprising forming GaN based contact regions above an active region, etching the initially formed natural or otherwise oxide layer on a surface of the GaN based contact region, forming an intermediate region consisting essentially of GaN and one selected from the group consisting of S, Se, Te, As, P, and Hf, and forming a metal electrode on the intermediate region consisting essentially of GaN and one selected from the group consisting of S, Se, Te,As,P,Hf.

In a fifth aspect, the present invention provides a method of manufacturing the semiconductor device comprising forming a first GaN based region, etching a surface of the first GaN based region, forming a second GaN based region comprising an element, the element terminating dangling bonds of the GaN surface, and forming a metal layer on the second GaN based region.

In a sixth aspect, the present invention provides a semiconductor device, comprising a structure in which Hf regions are introduced into the structure at either side of the active region, next to the cladding regions, such that the light confinement qualities of the structure are enhanced.

The present method of manufacturing the semiconductor device may include depositing a very thin oxide layer, a few monolayers 8 Å to 25 Å, onto the cleaned contact region of the GaN surface. This thin layer can be obtained by slowly growing oxide, for example, induced by immersion in hot water or by thermal treatment conducted in a atmosphere containing a low percentage of oxygen. To induce high band offsets between the contact metal and the GaN layers, such as for a Schottky barrier device, the use of other etchants which leave ions on the rinsed surface of the materials is the preferred method, for example the use of a NaOH etch leaves Na ions to hamper the contact to the GaN material. Also, using substances that promote these surface related defects, a low operation voltage stripe constricted laser diode may be constructed. The overall result is devices of the present invention with the required output characteristics and that have higher efficiencies and longer lifetimes than conventional devices. The other elements selected from the group consisting of S, Se, Te, As, P and Hf or the alloy can be used as an alternative to O. The thin layer of the present invention using O described above and other elements, such as S, Se, Te, As, P and Hf can be introduced to the surface of any nitride of III–V substances with any metal formed on the surface. The thin layer can be obtained, depending on the material chosen, by chemical treatment, direct deposition or actual crystal growth methods. The control of the thickness of the material or time of exposure to the material, allows the device characteristics to be controlled in such a fashion as to promote the required device characteristics. The present invention can be applied to the ohmic contact of a GaN-based typical semiconductor laser device, light emitting device (LED), photo diode, or transistor. Also, using one of these treatments, Hf, within the actual device structure itself enables enhanced control over the light confinement properties of the structure.

BRIEF DESCRIPTION OF THE DRAWINGS

A more complete appreciation of the invention and many of the attendant advantages thereof is readily obtained as the same becomes better understood by reference to the following detailed description when considered in connection with the accompanying drawings, wherein:

FIGS. 1a, 1b, and 1c are schematic cross-sectional views showing the method of forming the metal electrode on the oxidized surface of GaN affected by an HF etch.

FIGS. 2 is a schematic energy band diagram showing the effect of the surface states and/or the residual impurities left by the etch on the position of energy levels of evaporated metal contacts.

FIG. 3 is a schematic energy band diagram according to a first embodiment of the present invention.

DESCRIPTION OF THE PREFERRED EMBODIMENT

Figure 4A:
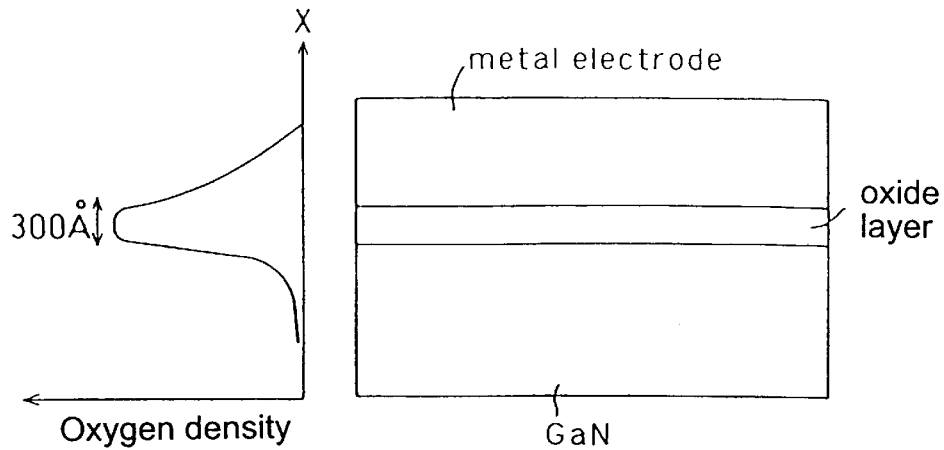
FIGS. 4a, 4b, and 4c are schematic cross-sectional views and graphs showing oxide profiles for GaN surfaces with differing oxide thicknesses according to a second embodiment of the present invention.

In various aspects, the present invention relates to a method of manufacturing a semiconductor light emitting device and to a semiconductor light emitting device which takes advantage of controlling the oxidation of the alloy based III–V material surface, and thus obtain a low band offset between the contact metal and the alloy based III–V material.

FIGS. 1a, 1b, and 1c are schematic cross-sectional views showing the intermediate layer between a metal electrode and a GaN layer along with a method of forming the metal electrode on the oxidized surface of the GaN layer which is affected by an HF etching. After being formed by Metal Organic Chemical Vapor Deposition (MOCVD), the surface of the GaN-based contact layer is exposed to the metal contact during metal evaporation as well as impurities introduced during the process through which the surface has gone to reach this stage under normal processing techniques. The surface of the GaN is at first found to have a thick oxide layer which is oxygen dominated as shown in FIG. 1a. By Secondary Ion Mass Spectroxcopy (SIMS), the layer is found to have a thickness of approximately 300 Å to 500 Å and contain carbon provided from the previous process. Making a metal contact to this surface results in a high operation voltage due to the fact that the oxide dominated layer has high resistance. Thus, as shown in FIG. 1b, by etching with an HF based etchant such as buffered HF, the oxide layer is reduced approximately to range from 3 Å to 5 Å, and the oxide content is also reduced substantially. The operation voltage of the Shottky contact of the GaN and the metal electrode formed on the oxide layer, as shown in FIG. 1c, is lowered as would be expected. However, it is also noted that the presence of residual fluorine impurities of HF etchant, at the surface, as well as the natural surface states, are relevant factors in the mechanism of carrier conduction into the GaN layer. Note that etching with other etchants results in similar problems, if not worse, as they leave thicker oxide layers as well as more potent residual impurities. For example, NaOH etching leaves Na on the surface whilst HCl leaves Cl on the surface. This large concentration of surface states along with the residual impurities on the surface cause the position of the metal fermi-energy level to rise up beyond the level expected and be pinned, down in the n-type GaN case, leaving a very high Schottky barrier for the carriers to overcome.

FIG. 2 is a schematic band diagram of the p-type GaN layer and metal deposited on the surface. As shown in FIG. 2, the barrier height is increased to and pinned at $\phi B1$. The pinning of the fermi-energy levels is discussed in S. M. Sze, *Physics of Semiconductor Devices*, $2^{nd}$ ED., John Wiley & Sons, 1981, p.276.

A very thin layer of pure oxide is now introduced onto the surface, and at the same time the F atoms are removed from the surface to obtain a near perfect ohmic contact to the GaN layer according to the first embodiment of the present invention. The pure oxide is formed by thermal treatment in a dry or wet ambient with low oxygen pressure. The thickness of the thin layer can be controlled, and ranges from 1 Å upwards have enough effect to obtain the effect described in this specification. The thickness of the thin layer of pure oxide to obtain better results has a range from 8 Å to 25 Å. This range is preferable to enable sufficient carriers to tunnel through the oxide by the quantum tunnel effect without unduly raising the contact resistance. Thicker than 25 Å, oxide region may induce a high operation voltage due to it being an insulator. A thickness less than 8 Å may not provide effective coverage of the GaN layer to nullify the surface states. Of course the F atoms left by the HF etch represent a disrupting influence in pulling the metal contact's energy level in such a manner as to increase the Schottky barrier height at the interface. Thus, removing F atoms leaves just the natural surface defects on the surface of the GaN layer. The natural surface defects by their nature cannot be avoided. The natural surface states result from the presence of dangling bonds at the final surface. Thus it is preferred to include a layer that when deposited onto these defects results in the dangling bonds being terminated and/or their influence being nullified so that the Schottky barrier height becomes what it should, (i.e., no pinning effects) with respect to the metal of the electrode. Such a layer may be an oxide based layer provided its thickness is as specified above.

FIG. 3 is a schematic energy band diagram according to a first embodiment of the present invention. The resultant Schottky barrier $\phi B2$ is much reduced in comparison to that in FIG. 2. When Pt is used, for example, as the metal electrode, $\phi B1$ was 1 eV and on the other hand $\phi B2$ was evaluated to be much smaller at 0.6 eV, by X-ray Photoelectron Spectroscopy. These Schottky barriers are an exponent of each of the effective contact resistances, and therefore of the reduction of the operation voltage is large enough to merit the use of the present invention.

Figure 4B:
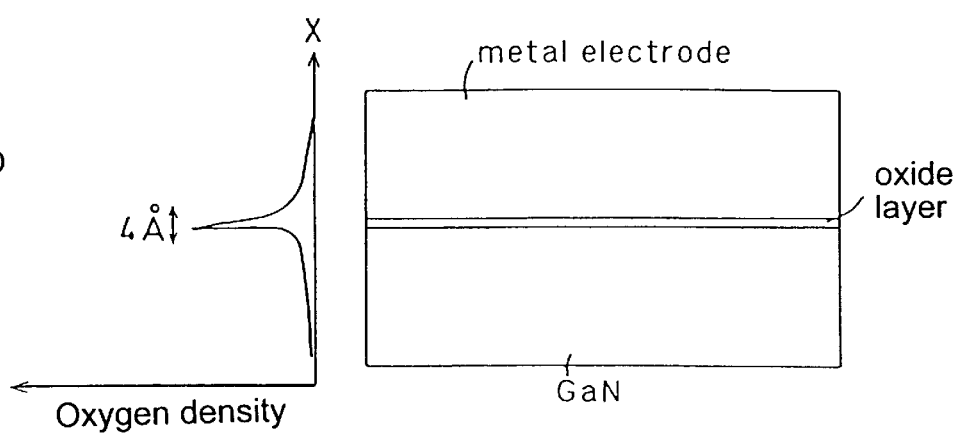
Figure 4C:
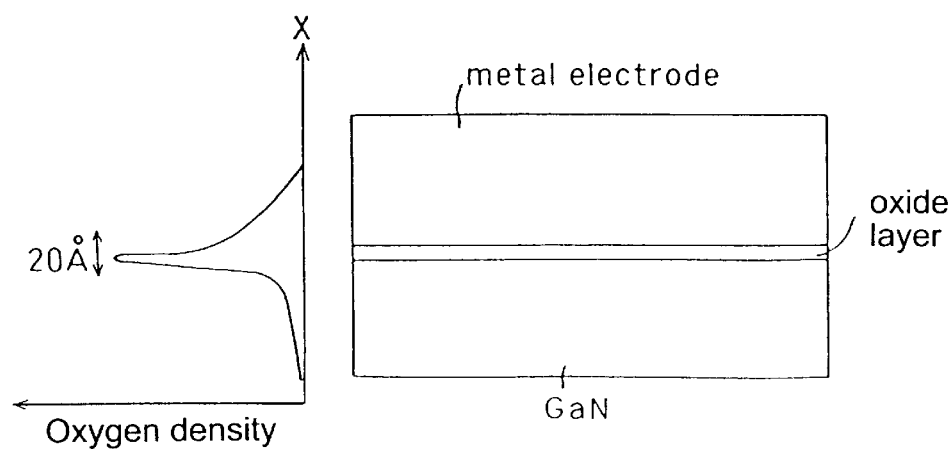

FIGS. 4a, 4b, and 4c show oxygen density profiles of the various GaN based surfaces with metal electrodes evaporated on the oxide surfaces according to a second embodiment of the present invention. The $O_2$ density were measured by SIMS. The overall thickness of the induced oxide layers are different in all three cases. In FIG. 4a, the initial oxide layer, usually naturally present on the GaN surface, is very thick and is about 300 Å, and thus the series resistance of this oxide layer becomes excessively large. In FIG. 4b, the layer is now in the order of one monolayer and this is the kind of surface left after cleaning with the HF based etches. This may seem to be the best as the oxide layer's resistance is very small, and thus the contact resistance may be expected to be the least. However, the influence of the surface states and the remaining F atoms at the surface promote the pinning of the metals energy level deep within the GaN band gap causing a high Schottky barrier to be present and raising the contact resistance accordingly. In FIG. 4c, the oxide layer is thick enough to nullify the effects of this pinning without being too thick to cause excessive series resistance, and it is at this point that the contact resistance is minimized. This oxide region is obtained by thermal oxidation at a low $O_2$ pressure at about 300° C. By this method, F atoms are sufficiently eliminated, and a low resistance ohmic contact is obtained.

Figure 5:
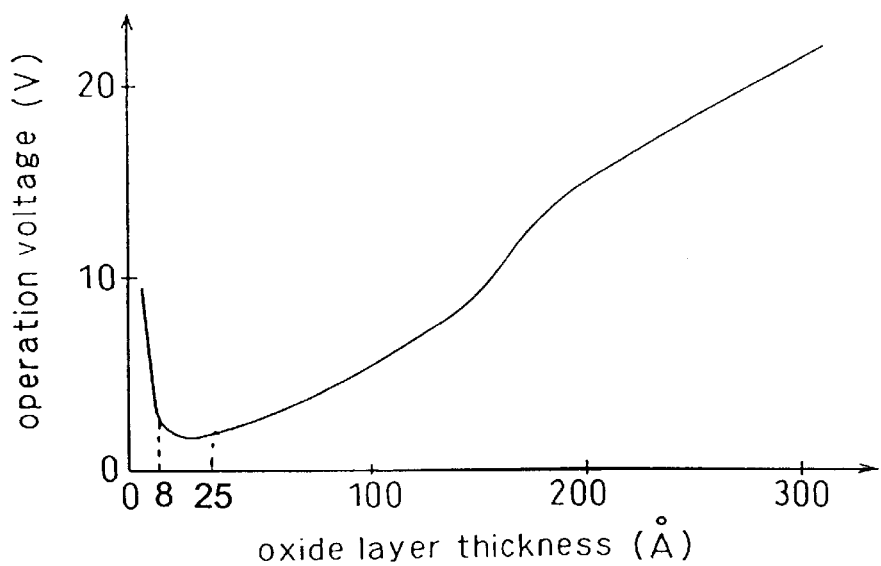
FIG. 5 is a graph showing the effect of the oxide layer thickness on the operation voltage of a GaN light emitting diode according to the second embodiment of the present invention.

FIG. 5 is a graph showing the relation between the operational voltage and the oxide thickness for the operation of a light emitting diode of the second embodiment of the present invention and showing the optimum point to obtain ohmic contact occurring in the range 8–25 Å.

Figure 6:
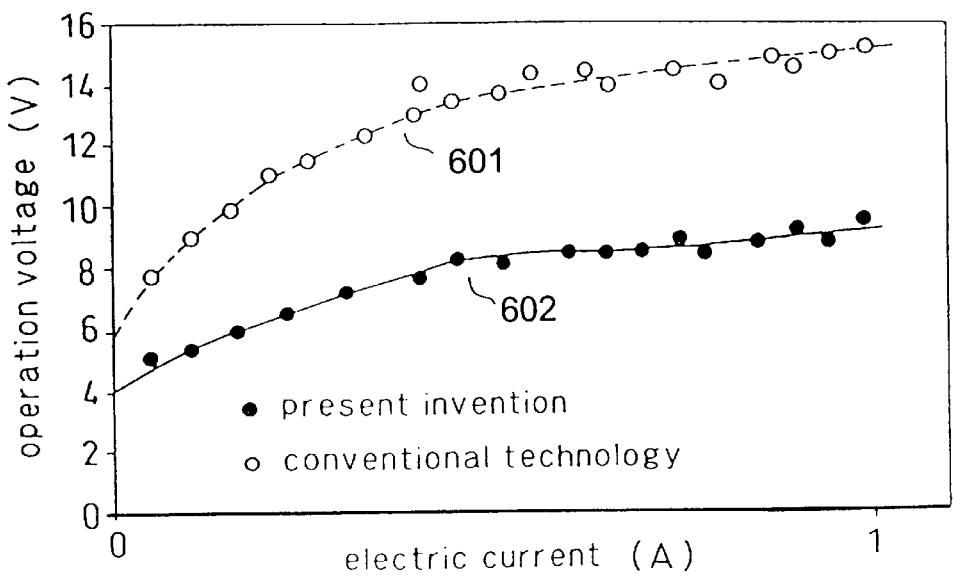
FIG. 6 is a graph illustrating experimental data showing how the current-voltage curves are improved by use of a new treatment of a third embodiment of the present invention.

FIG. 6 is a graph showing evaluation results of ohmic contacts according to a third embodiment of the present invention. A line 601 shows the ohmic contact obtained by the conventional technology that is to evaporate a metal electrode on the oxide surface which was gained by etching of the initial oxide surface with HF etchant. A line 602 shows the ohmic contact obtained by the method of the present invention which inserted an extra process, in which the GaN surface is washed in hot water, from 70 to 95° C., for about a minute, between the HF etch and the metal evaporation. During this additional step, F atoms are removed and a high purity oxide layer is formed. And from this the voltage is substantially reduced using the hot water treatment.

Figure 7:
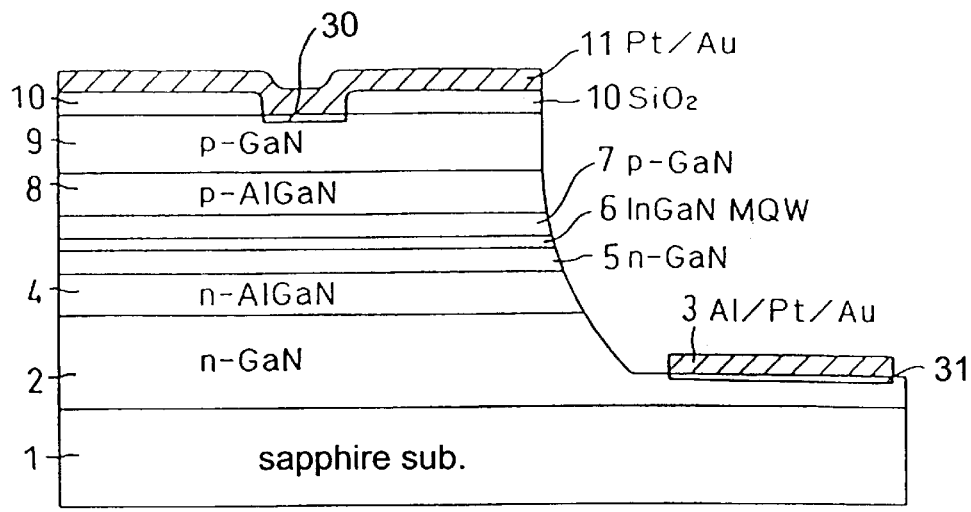
FIG. 7 is a schematic cross-sectional view of the GaN alloy based stripe laser device formed on a sapphire substrate according to a fourth embodiment of the present invention.
Figure 8:
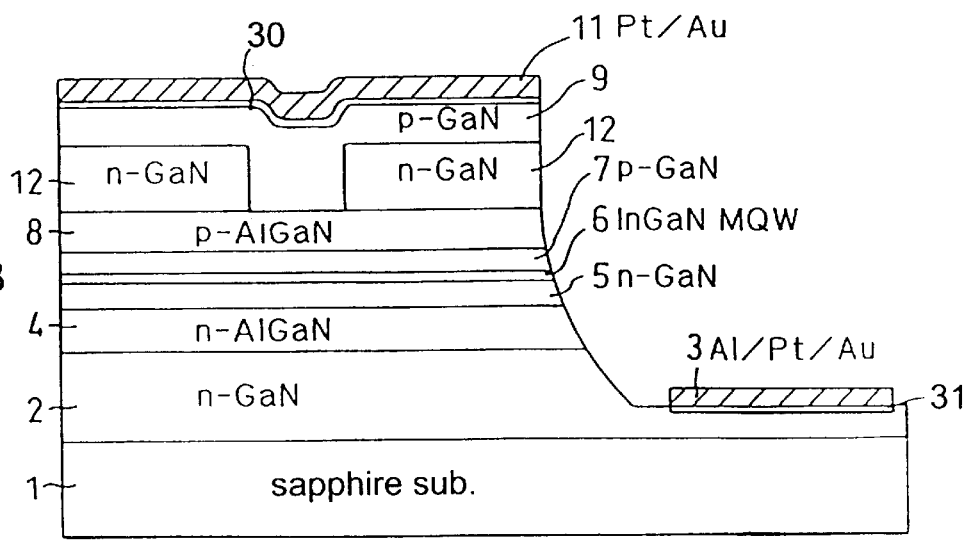
FIG. 8 is a schematic cross-sectional view of the GaN alloy based isolated stripe laser device formed on a sapphire substrate according to a modification of the fourth embodiment of the present invention.

FIGS. 7 and 8 show schematic cross-sectional views of two GaN based semiconductor laser devices according to a fourth embodiment of the present invention.

The ohmic contacts described above may be introduced between an n-type GaN based contact layer 2 and an Al/Pt/Au electrode 3 and also between a p-type GaN based contact layer 9 and a Pt/Au electrode 11 of each device as shown in respective FIGS. 7 and 8. The short wavelength light emitting device comprises an InGaN Molecular Quantum Well (MQW) active layer 6, surrounded on its lower and upper surface by an n-type optical guide layer S and a p-type optical guide layer 7, respectively. The device cladding layers 4 and 8 are formed of AlGaN, which supply the large band gap that permits efficient restriction of the carriers and the resultant optical output to the active layer 6 of the device. Both of the complete devices are grown onto corresponding sapphire substrates 1 as shown in FIGS. 7 and 8. The current confinement is achieved via an isolated stripe region 30 surrounded by an insulator, such as $SiO_2$ layers 10, as shown in FIG. 7. Note that other methods of current and optical confinement can be used with the present invention such as that shown in FIG. 8; an isolated stripe laser device using n-type GaN layers 12 is inserted between the contact region 9 and the AlGaN clad layer 8 to surround the isolated stripe region of the device. An oxide layer 31 is disposed between the Al/Pt/Au electrode 3 and the contact layer 2 for current confinement.

Figure 9:
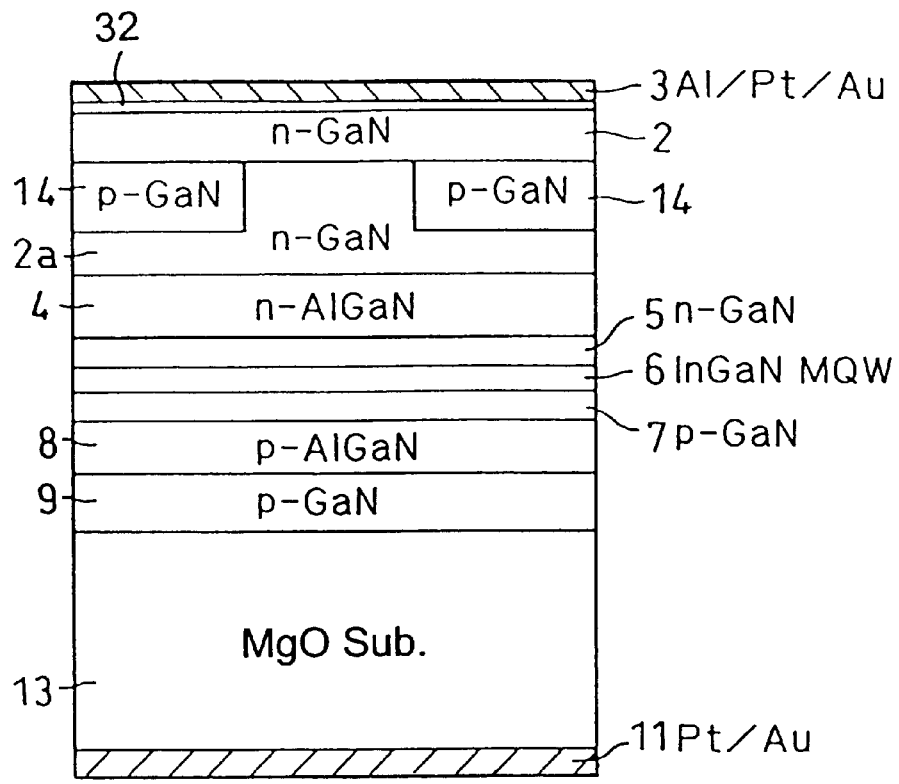
FIG. 9 is a schematic cross-sectional view of the GaN alloy based stripe laser device formed on a p-type MgO substrate according to a fifth embodiment of the present invention.
Figure 10:
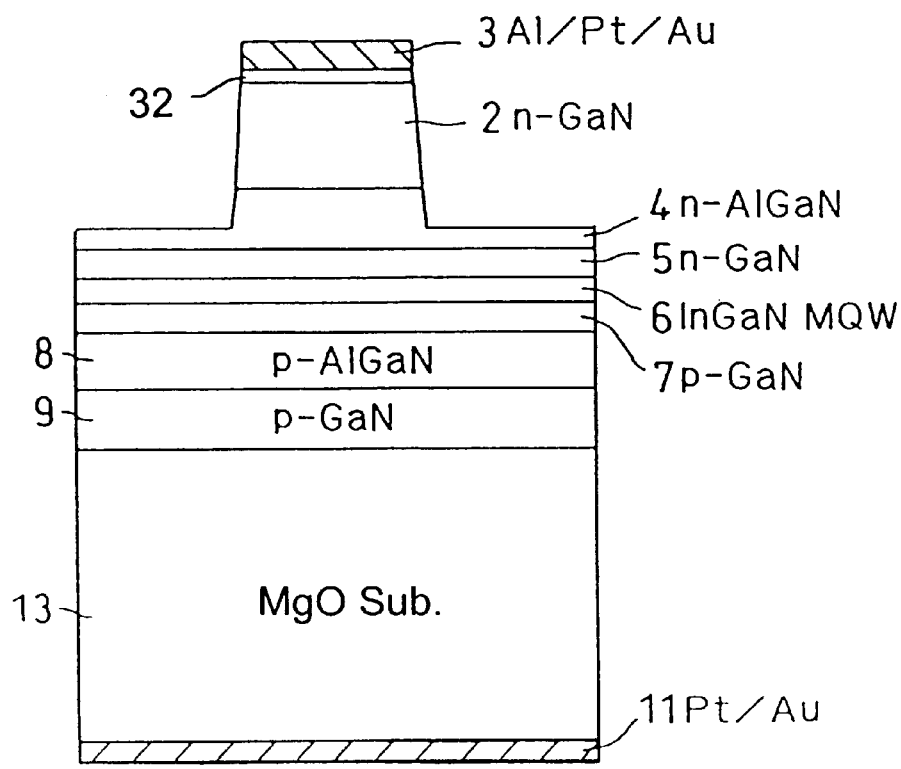
FIG. 10 is a schematic cross-sectional view of the GaN alloy based stripe laser device formed on a p-type MgO substrate according to a modification of the fifth embodiment of the present invention.

FIGS. 9 and 10 show schematic cross-sectional views of two GaN based semiconductor laser devices according to the fifth embodiment of the present invention.

In this embodiment, the device comprises a p-type MgO substrate 13 and a multilayer structure formed above main surface of the conductive MgO substrate 13. The multilayer structure comprises the p-type GaN based contact layer 9, AlGaN cladding layers 4 and 8, an n-type GaN based contact layer 2a, the InGaN Molecular quantum Well (MQW) active layer 6, the optical guide layer 5 formed of n-type GaN, the optical guide layer 7 formed of p-type GaN, and the Al/Pt/Au electrode 3. A Pt/Au electrode 11 is formed to contact the multilayer structure through a conductive MgO substrate 13. The device has p-type GaN regions 14 of selectively buried ridge (SBR) structure surrounding a protrusion of the n-type GaN 2a. The ohmic contact of this embodiment of the present invention is formed of the n-type GaN layer 2 and the Al/Pt/Au electrode 3 with an oxide layer 32 therebetween.

FIG. 10 shows another SBR structure without using the p-type GaN layers 14 and the n-type contact layer 2a. The electrode 3 is formed on the n-type GaN layer 2 functioning as a contact layer with the oxide layer 32 therebetween. This structure can be manufactured with higher productivity because of the absence of epitaxial steps of the p-type GaN regions 14 shown in FIG. 9.

Figure 11:
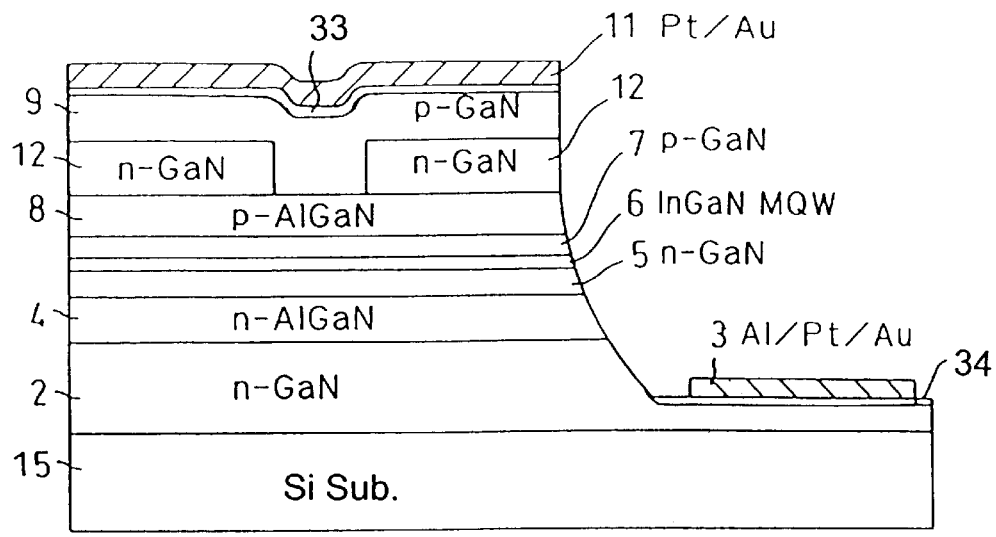
FIG. 11 is a schematic cross-sectional view of the GaN alloy based stripe laser device formed on a doped Si substrate of a sixth embodiment of the present invention.
Figure 12:
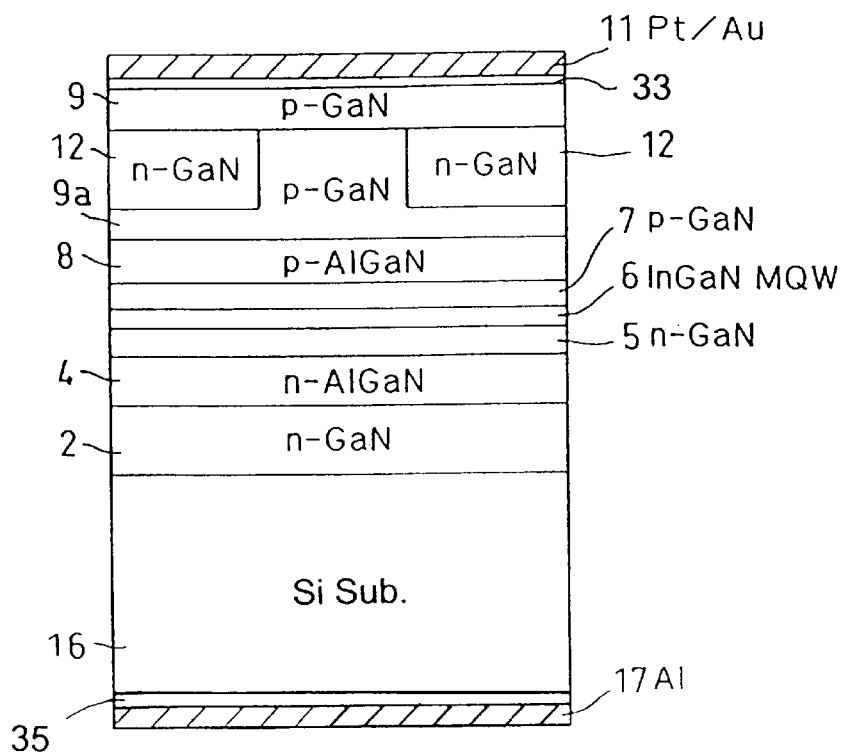
FIG. 12 is a schematic cross-sectional view of the GaN alloy based stripe laser device formed on a doped Si substrate according to a modification of the sixth embodiment of the present invention.

FIGS. 11 and 12 show schematic cross-sectional views of two GaN based semiconductor laser devices according to a sixth embodiment of the present invention.

In FIG. 11, the device comprises a non doped Si substrate 15 and a multilayer structure. The multilayer structure comprises the p-type GaN based contact layer 9, the AlGaN cladding layers 4 and 8, the n-type GaN based contact layers 2 and 12, the InGaN MQW active layer 6, the optical guide layer 5 formed of n-type GaN, the optical guide layer 7 formed of p-type GaN, and the Al/Pt/Au electrode 3 formed above the low conductivity Si substrate 15. Because of the low conductivity of the non doped Si substrate 15, the Al/Pt/Au electrode 3 is disposed on an upper surface of a cross-sectional end region of the n-type GaN contact layer 2. The ohmic contact of this embodiment of the present invention is formed in the p-type GaN contact layer 9 and the Pt/Au electrode 11 with an oxide layer 33 therebetween and also formed in the n-type GaN contact layer 2 and the Al/Pt/Au electrode 3 with an oxide layer 34 therebetween.

A device using a conductive n-type Si substrate 16 having a lower surface contacting an Al electrode 17 and a SBR structure is shown in FIG. 12. A p-type GaN contact layer 9a is disposed on the AlGaN cladding layer 8. The contact layer 12 is disposed on the contact layer 9a. The oxide layer 35 of the present invention is formed in the contact region of the n-type Si substrate 16 and the Al electode 17. A p-type Si substrate is an alternative to the n-type Si substrate with a p-type side of the multilayer structure on the Si substrate surface. FIGS. 13 through 16 are graphs of experimental data. In a very thin region, about 8 Å to 25 Å, a surface reactant, either S, Se, Te, As, P or Hf, as an alternative to O, is introduced onto the oxide reduced GaN surface and at the same time the F atom is removed from the surface to obtain an improved ohmic contact to GaN.

Figure 13:
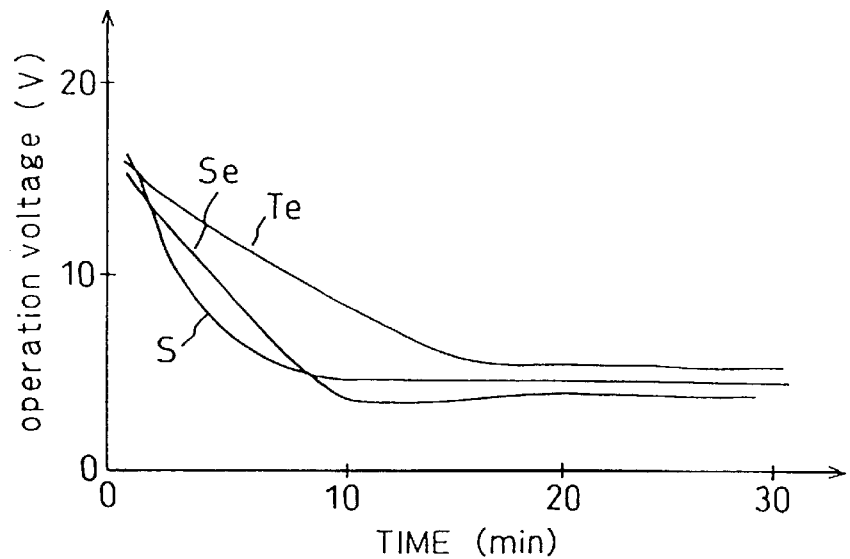
FIG. 13 is a graph of experimental data showing the change of operation voltage with time for GaN surfaces with S, Se and Te treatment.
Figure 14:
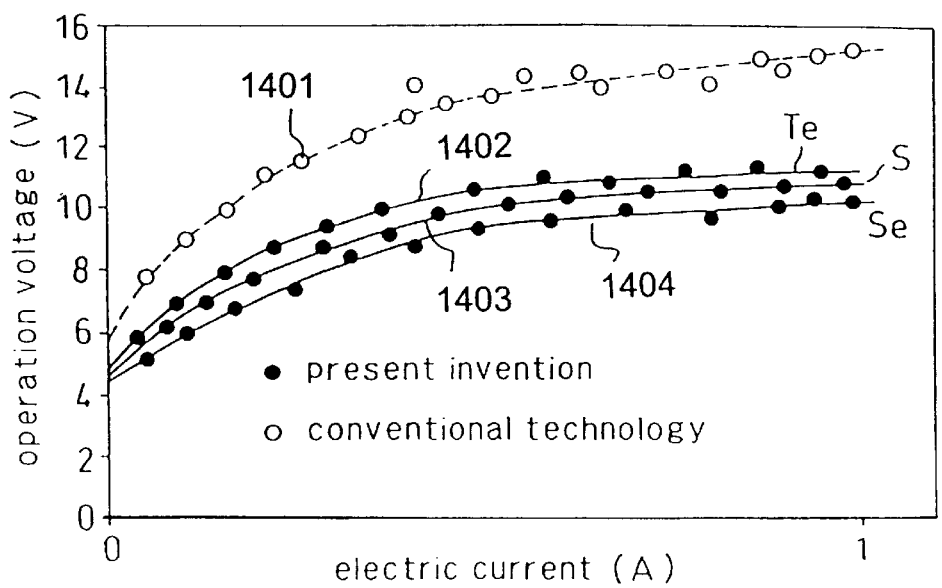
FIG. 14 is a graph of experimental data showing the effect of S, Se and Te treatments on the current/voltage characteristics of GaN light emitting diodes.

At the elemental profile of the various surfaces, no distinct intermediate layer of S, Se, or Te could be found. This is because a chemical treatment method in which the GaN surface is dipped into a solution of the relevant surface reactant is used, and thus no thin layer as such is resultant but the surface defects are reduced. The time of the treatment varies with reactant but is on average 10 minutes, as shown in FIG. 13. Using this method, the effects of the fermi-energy level pinning are nullified without causing any increase in the series resistance. These results are summarized in FIG. 14 for the operation current/voltage characteristics of a light emitting diode and clearly shows the improvements involved. Line 1401 shows the operation voltage characteristic for conventional technology. Lines 1402, 1403, and 1404 show the operation voltage when using Te, S, and Se, respectively, in accordance with the present invention.

Figure 15:
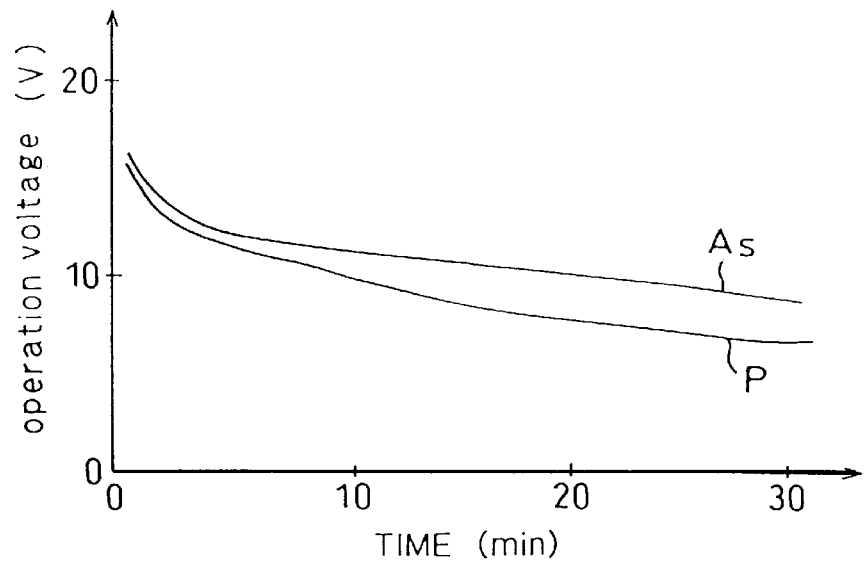
FIG. 15 is a graph of experimental data showing the change of the operation voltage for the GaN surfaces with As and P treatments.
Figure 16:
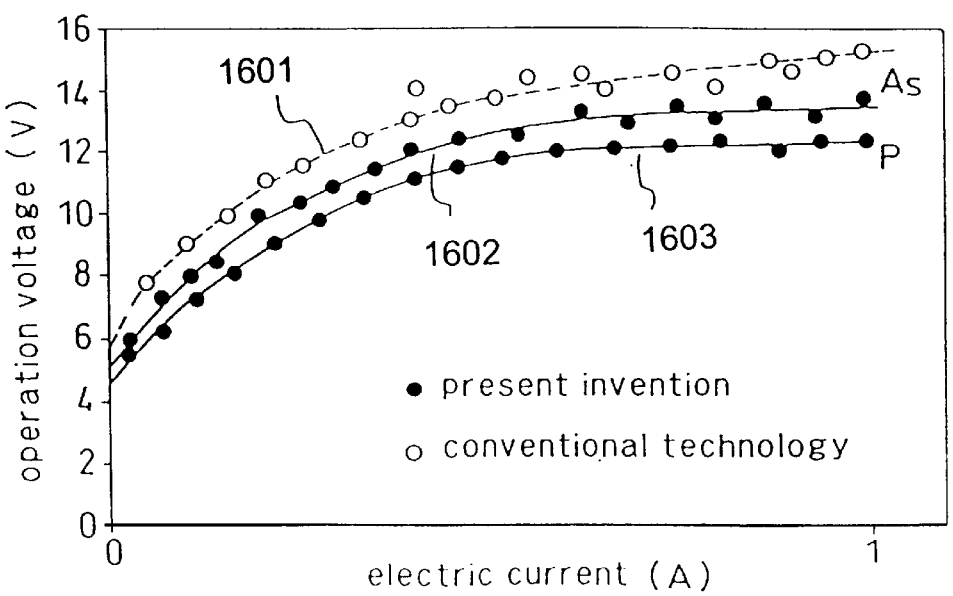
FIG. 16 is a graph of experimental data showing the effect of As and P treatments on the current/voltage characteristic of GaN light emitting diodes.

The use of As and P is almost identical to that already described above for S, Se, Te, except that the effect is much less in these cases as can be seen in FIGS. 15 and 16. Note that the required times are also much longer than in the previous cases. A line 1601 shows the operation voltage characteristic for conventional technology. Lines 1602 and 1603 show the operation voltage when using As and P, respectively, in accordance with the present invention.

Figure 17:
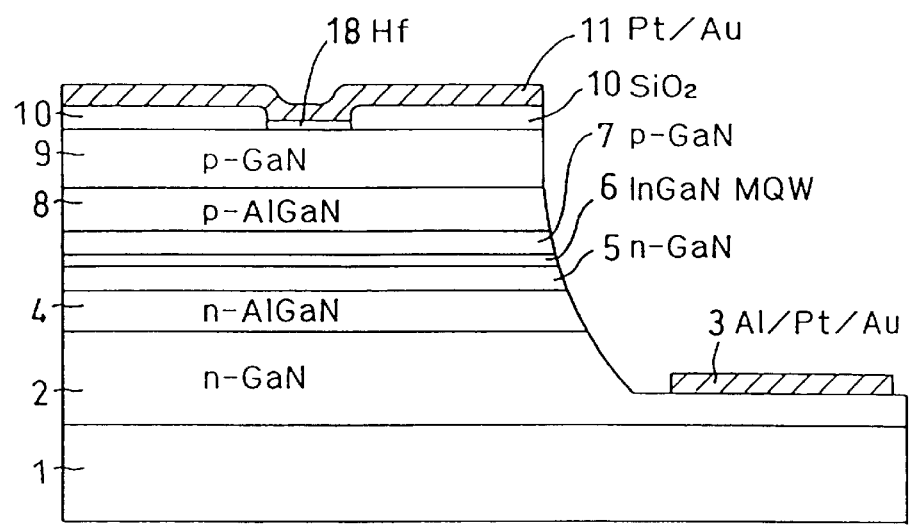
FIG. 17 is a schematic cross-sectional view of a GaN alloy based stripe laser device employing a Hf contact layer.

FIG. 17 is a schematic cross-sectional view of a GaN alloy based stripe laser device employing a Hf contact layer. In the case of Hf, the metal 18 is deposited onto the final GaN surface usually as part of the growth such as the surface of the p-type GaN contact layer 9 as shown in FIG. 17 in such a manner as to form crystalline Hf layer 13. This has the effect of keeping the upper surface free from surface defects by sealing the surface from the outside environment. Thus, this Hf layer 13 is best deposited, usually by Molecular Beam Epitaxy (MBE) or other such methods, in situ, that is within the growth chamber, because once the sample is exposed to the outside environment, it is very difficult to return it to its virgin state. The reason that Hf is so effective is due to its crystalline properties, the lattice constant of GaN is of the order of 0.318 nm whereas crystalline Hf has a lattice constant of 0.319 nm. This means that the interface between GaN and Hf is very clean, and the Hf keeps the GaN lattice at the surface in place an unstrained. In the case of no Hf, the GaN surface tends to crack due to the stress left at the surface of the crystalline material. The use of Hf results in a GaN surface unaffected by surface states, and thus reduces the Schottky barrier height between the contact metal and the GaN material. However, Hf has a low workfunction (3.9 eV) and thus is not a very good metal for making a contact to p-type GaN. Presently used electrodes (Pt, Ni, Pd etc.) have workfunctions in excess of 5 eV. Thus, the thickness of the Hf layer is kept thin, preferably less than 4 nm. However, when the layer gets too thin, it is less effective.

Figure 18:
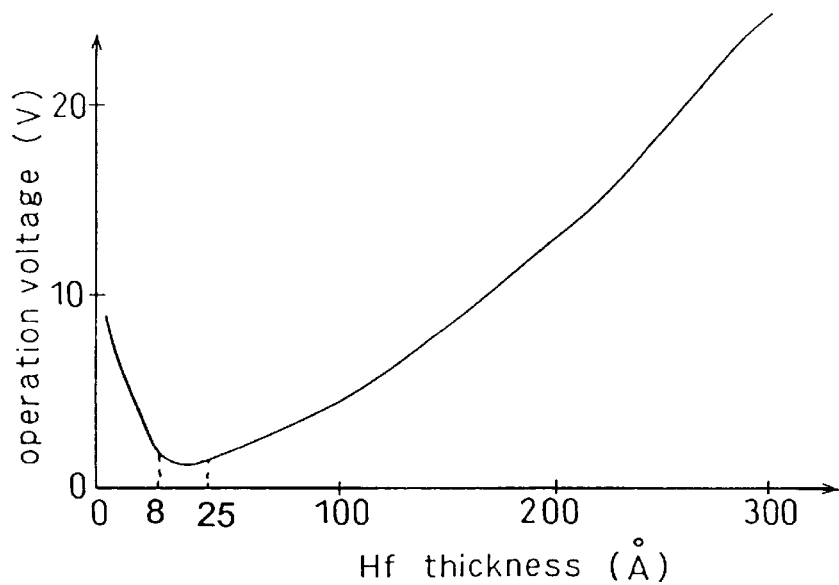
FIG. 18 is a graph of experimental data showing the change of the operation voltage for GaN surfaces with Hf thickness.

FIG. 18 is a graph of experimental data showing the change of the operation voltage for GaN surfaces with Hf thickness. By choosing the preferred thickness of Hf metal the operation voltage of GaN devices is significantly reduced.

Figure 19:
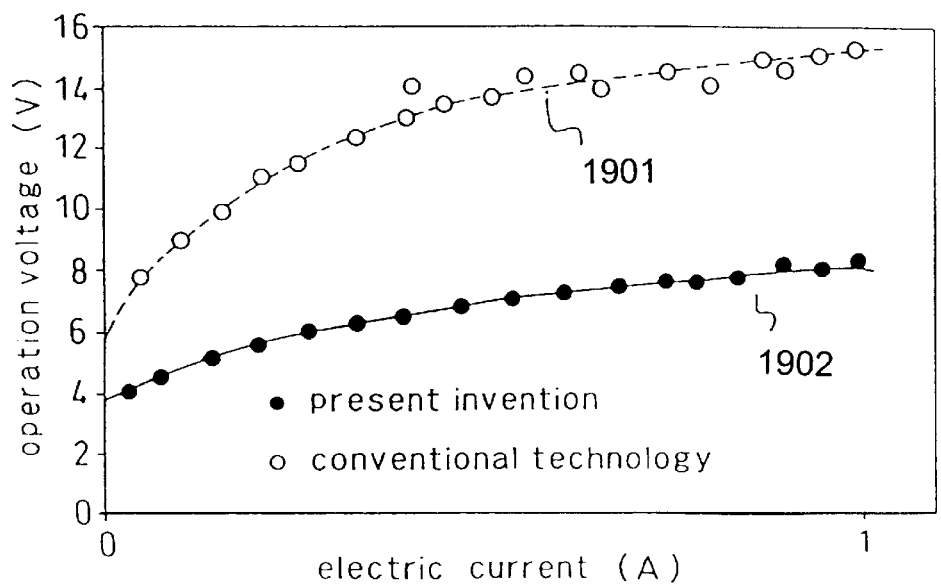
FIG. 19 is a graph of experimental data showing the effect of the use of Hf contact layer on the current/voltage characteristics of GaN light emitting diodes.

FIG. 19 is a graph of experimental data showing the effect of the use of Hf contact layer on the current/voltage characteristics of GaN light emitting diodes. A line 1901 shows the operation voltage characteristic in accordance with the present invention. A line 1902 shows the operation voltage characteristic using conventional technology. One more important aspect of the use of Hf in these devices is the actual use of it within the cystalline structure itself. This is possible due to the close lattice constants of both GaN and Hf resulting in almost no introduced lattice strain between such layers.

Figure 20:
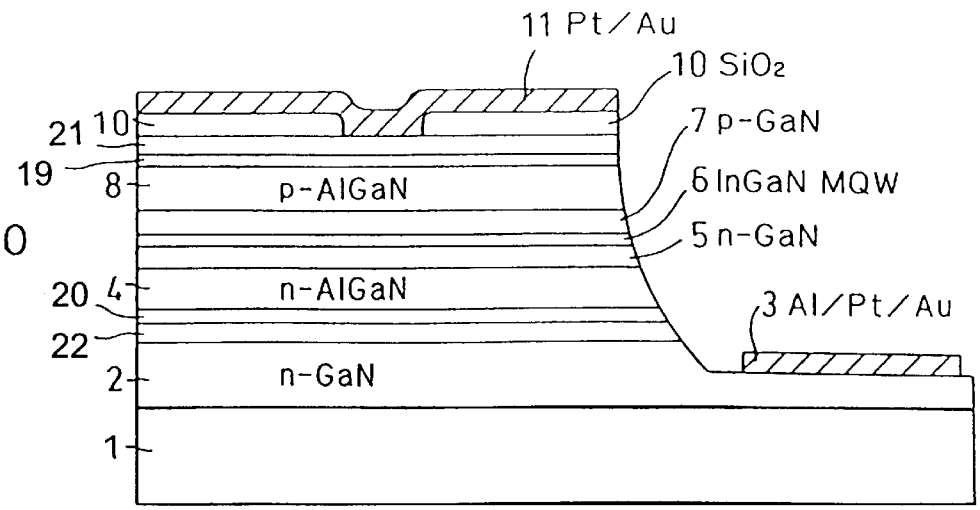
FIG. 20 is a schematic cross-sectional view showing a GaN alloy based stripe laser device employing Hf regions to improve laser qualities.

FIG. 20 is a schematic cross-sectional view showing a GaN alloy based stripe laser device employing Hf regions to improve laser qualities. Hf layers 21 and 22 and GaN layers 19 and 20 are introduced on either side of the AlGaN cladding layers 4 and 8. These have two effects. The first is layers 21 and 22 reflect about 50% of the incident light back into the active layer 6. This type of effect is called photon recycling in which photons that are usually lost from the active layer in normal lasers are reintroduced into the active layer which in turn boosts the gain and reduces the threshold currant of the said lasers. The second effect is the absorption of the light in the Hf layers. This second effect is of importance as such absorption results in a very effective light guide layer which makes the laser lases in certain laser modes and makes lasing in single mode formats much easier to obtain. Thus, FIG. 20 shows an example of such a laser.

Figure 21:
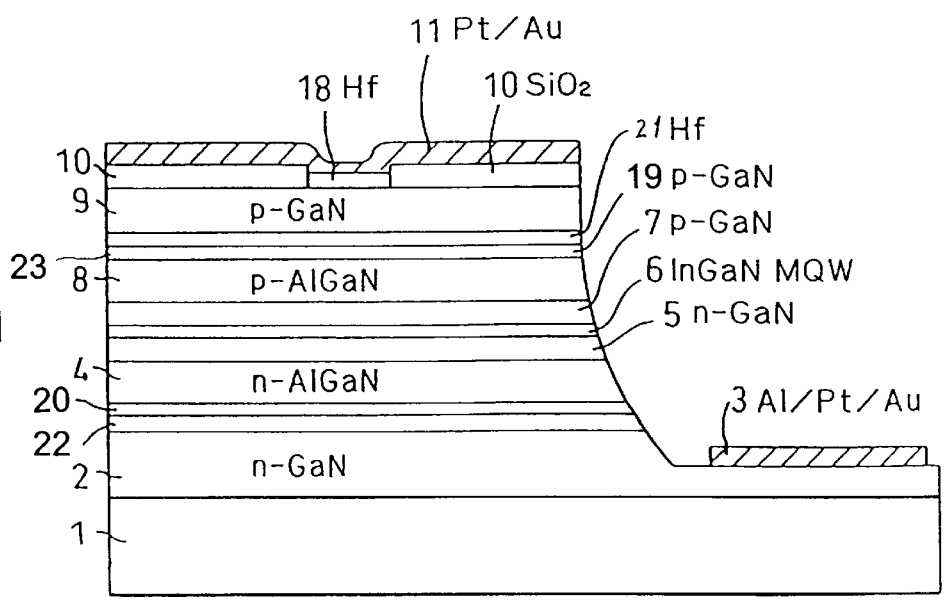
FIG. 21 is a schematic cross-sectional view showing a GaN alloy based stripe laser device of more advanced design employing Hf layers to further improve laser qualities.

FIG. 21 is a schematic cross-sectional view showing a GaN alloy based stripe laser device of more advanced design employing Hf layers to further improve laser qualities. One way of overcoming this limitation is shown in FIG. 21. Here the layer 21 is topped by a p-type GaN contact layer 9, and the Hf layers 21 and 22 are independent of the contact Hf layers 18. This allows thicker Hf layers 21 and 22 to be used, although again if the layers get too thick the combination of p-type GaN 9/Hf 21/p-type GaN 23 produces a high resistive area of the device.

Figure 22:
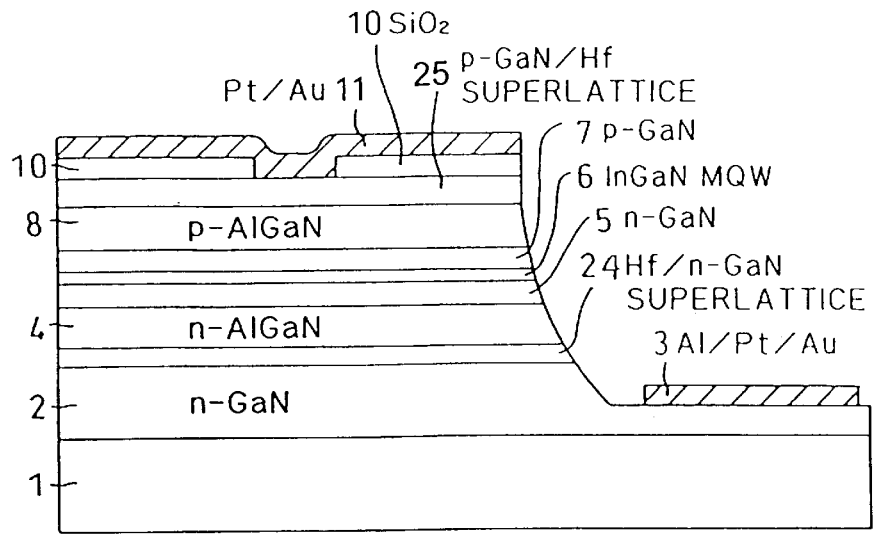
FIG. 22 is a schematic cross-sectional view showing a GaN alloy based stripe laser device employing Hf/GaN superlattice layers to further improve laser qualities.

FIG. 22 is a schematic cross-sectional view showing a GaN alloy based stripe laser device employing Hf/GaN superlattice layers to further improve laser qualities. The device shown in FIG. 22 increases the effect of using Hf layers. Here, Hf/GaN superlattices 24 and 25 are formed such that the total Hf thickness can be increased as far as required without affecting the total electrical resistance.

Figure 23:
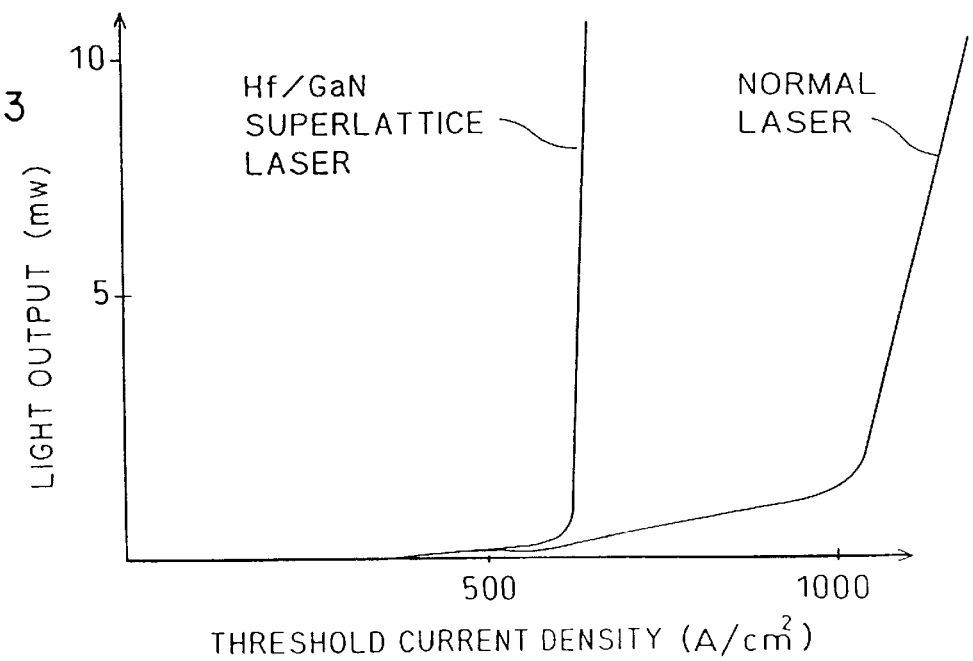
FIG. 23 is a graph of experimental data showing how the improvement in the light output-threshold current density curves due to the use of Hf within the structure.

FIG. 23 is a graph of experimental data showing how the improvement in the light output-threshold current density curves due to the use of Hf within the structure. The effect on the threshold current density of a GaN laser of FIG. 22 is shown in FIG. 23. The threshold current density is reduced by almost one half by the use of Hf. These Hf layer and Hf comprising superlattice structure can be introduced into the other device structures explained above.

Although various elements are described herein as layers or regions, one skilled in the art can modify the devices or methods to use layers instead of regions, and vice versa.

What is claimed is:

1. A semiconductor device comprising:
    a GaN based first contact region and a second contact region,
    an active region disposed between the GaN based first contact region and the second contact region,
    a first intermediate region having an average thickness in the range from 8 Å to 25 Å consisting of GaN and O and disposed on the first GaN based contact region,
    a first metal electrode disposed on the first intermediate region and forming an ohmic contact region with the first GaN based contact region through the intermediate region, and
    a second metal electrode coupled to the second contact region.

2. A semiconductor device, as set forth in claim 1, wherein the first metal electrode comprises a metal selected from the group consisting of Ni, Pd, Ir, Au, Pt, and Hf or an alloy based on a metal selected from the group.

3. A semiconductor device, as set forth in claim 1, further comprising a second intermediate layer disposed between the second contact region and the second electrode, wherein the second contact region is GaN based.

4. A semiconductor device, as set forth in claim 3, further comprising an insulator or counter doped region and an isolated stripe region surrounded by the insulator or counter doped region.

5. A semiconductor device, as set forth in claim 1, further comprising first and second clad regions, a first optical guide region disposed between the active region and the first clad region, a second optical guide region disposed between the active region and the second clad region, the first clad region disposed between the first optical guide region and the first GaN based contact region, and the second clad region disposed between the second optical guide region and the second contact region.

6. A semiconductor device, as set forth in claim 5, further comprising a second intermediate layer consisting of GaN and O, wherein a multilayer structure comprising the active region, the GaN based first contact region, the second contact region, the first intermediate region, the first metal electrode, the second metal electrode, the first optical guide region, the first clad region, the second optical guide region, and the second clad region is disposed above an insulator substrate, the second contact region is GaN based, and the second electrode is disposed on the second contact region through the second intermediate layer.

7. A semiconductor device, as set forth in claim 5, wherein a multilayer structure comprising the active region, the GaN based first contact region, the second contact region, the first intermediate region, the first metal electrode, the second metal electrode, the first optical guide region, the first clad region, the second optical guide region, and the second clad region is disposed above a first surface of a conductive substrate, and the second metal electrode is disposed on a second surface of the conductive substrate.

8. A semiconductor device, as set forth in claim 1, wherein dangling bonds of GaN in the first contact region are terminated with O.

* * * * *